(12) United States Patent
Nittka

(10) Patent No.: US 10,126,400 B2
(45) Date of Patent: Nov. 13, 2018

(54) METHOD AND MAGNETIC RESONANCE APPARATUS FOR RECONSTRUCTION OF A THREE-DIMENSIONAL IMAGE DATA SET FROM DATA ACQUIRED WHEN A NOISE OBJECT DISTORTED THE MAGNETIC FIELD IN THE APPARATUS

(71) Applicant: Siemens Aktiengesellschaft, Munich (DE)

(72) Inventor: Mathias Nittka, Baiersdorf (DE)

(73) Assignee: Siemens Aktiengesellschaft, Munich (DE)

( * ) Notice: Subject to any disclaimer, the term of this patent is extended or adjusted under 35 U.S.C. 154(b) by 670 days.

(21) Appl. No.: 14/741,971

(22) Filed: Jun. 17, 2015

(65) Prior Publication Data

US 2015/0362577 A1 Dec. 17, 2015

(30) Foreign Application Priority Data

Jun. 17, 2014 (DE) .................. 10 2014 211 572

(51) Int. Cl.
*G01R 33/565* (2006.01)
*G01R 33/56* (2006.01)
(Continued)

(52) U.S. Cl.
CPC .... *G01R 33/56536* (2013.01); *G01R 33/4828* (2013.01); *G01R 33/4835* (2013.01);
(Continued)

(58) Field of Classification Search
CPC ............ G01R 33/5608; G01R 33/4835; G01R 33/543; G01R 33/5611; G01R 33/4828
(Continued)

(56) References Cited

U.S. PATENT DOCUMENTS 5,208,534 A * 5/1993 Okamoto ........... G01R 33/3415
324/307
8,217,652 B2 * 7/2012 Dannels ............. G01R 33/5659
324/309
(Continued)

OTHER PUBLICATIONS

De Haan, Bianca, and Chris Rorden. "An introduction to functional MRI."*
(Continued)

*Primary Examiner* — Christopher McAndrew
(74) *Attorney, Agent, or Firm* — Schiff Hardin LLP

(57) ABSTRACT

In a method for reconstruction of a three-dimensional image data set from magnetic resonance slice data of a target region acquired in target slices while a noise object distorting the magnetic field is present in the target region, for each target slice to be acquired, in addition to a central partition slice corresponding to the respective target slice, location, multiple partition slices adjacent to the central partition slice are acquired in a supplementary encoding direction perpendicular to the slice plane in multiple phase-encoding steps. A correction area and a standard reconstruction area of the target region are determined on the basis of a distortion criterion, obtained by evaluating the slice data that describes the distortion along the supplementary encoding direction. In the standard reconstruction area, only slice data are used, and in the correction area, slice data of partition slices outside the target slice are assigned to target slices in order to correct the distortion.

9 Claims, 4 Drawing Sheets

(51) Int. Cl.
  *G01R 33/54* (2006.01)
  *G01R 33/48* (2006.01)
  *G01R 33/483* (2006.01)
  *G01R 33/561* (2006.01)

(52) U.S. Cl.
  CPC ........ *G01R 33/543* (2013.01); *G01R 33/5608* (2013.01); *G01R 33/5611* (2013.01)

(58) Field of Classification Search
  USPC ........................................................ 324/309
  See application file for complete search history.

(56) References Cited

U.S. PATENT DOCUMENTS

| | | | | |
|---|---|---|---|---|
| 8,554,490 | B2* | 10/2013 | Tang | A61B 6/466 |
| | | | | 702/19 |
| 8,559,744 | B2* | 10/2013 | Cao | G06T 3/4015 |
| | | | | 358/3.26 |
| 8,855,269 | B2* | 10/2014 | Arakita | A61B 6/03 |
| | | | | 378/165 |
| 8,988,075 | B2* | 3/2015 | Grodzki | G01R 33/565 |
| | | | | 324/307 |
| 9,572,545 | B2* | 2/2017 | Chen | A61B 8/085 |
| 2008/0136815 | A1* | 6/2008 | Matsumoto | G09G 5/393 |
| | | | | 345/419 |
| 2008/0205721 | A1* | 8/2008 | Udupa | G06K 9/6209 |
| | | | | 382/128 |
| 2008/0298661 | A1* | 12/2008 | Huang | G01R 33/5611 |
| | | | | 382/131 |
| 2009/0105579 | A1* | 4/2009 | Garibaldi | A61B 1/00158 |
| | | | | 600/409 |
| 2010/0033179 | A1 | 2/2010 | Hargreaves et al. | |
| 2010/0195879 | A1* | 8/2010 | Bernhardt | G06T 19/00 |
| | | | | 382/128 |
| 2011/0097008 | A1* | 4/2011 | Cao | G06T 3/4015 |
| | | | | 382/260 |
| 2011/0295579 | A1* | 12/2011 | Tang | A61B 6/466 |
| | | | | 703/9 |
| 2012/0027279 | A1* | 2/2012 | Avinash | G01R 33/5608 |
| | | | | 382/131 |
| 2012/0065494 | A1* | 3/2012 | Gertner | A61B 5/055 |
| | | | | 600/411 |
| 2012/0074941 | A1* | 3/2012 | Grodzki | G01R 33/4816 |
| | | | | 324/314 |
| 2013/0070990 | A1* | 3/2013 | Martel | G01R 33/5608 |
| | | | | 382/131 |
| 2013/0076356 | A1 | 3/2013 | Jellus et al. | |
| 2013/0182930 | A1* | 7/2013 | Trzasko | G06T 11/003 |
| | | | | 382/131 |
| 2013/0317347 | A1* | 11/2013 | Kwiat | A61B 8/0841 |
| | | | | 600/417 |
| 2014/0002080 | A1 | 1/2014 | Den Harder et al. | |
| 2014/0153807 | A1* | 6/2014 | Seong | G06T 7/0016 |
| | | | | 382/131 |

OTHER PUBLICATIONS

De Haan, Bianca, and Chris Rorden. "An introduction to functional MRI," APA.*
Lu et al., "SEMAC: Slice Encoding for Metal Artifact Correction in MRI", Magnetic Resonance in Medicine, vol. 62, pp. 66-76 (2009).
Smith et al., "Accelerating Sequences in the Presence of Metal by Exploiting the Spatial Distribution of Off-Resonance", Magnetic Resonance in Medicine, vol. 72, pp. 1658-1667 (2014).

\* cited by examiner

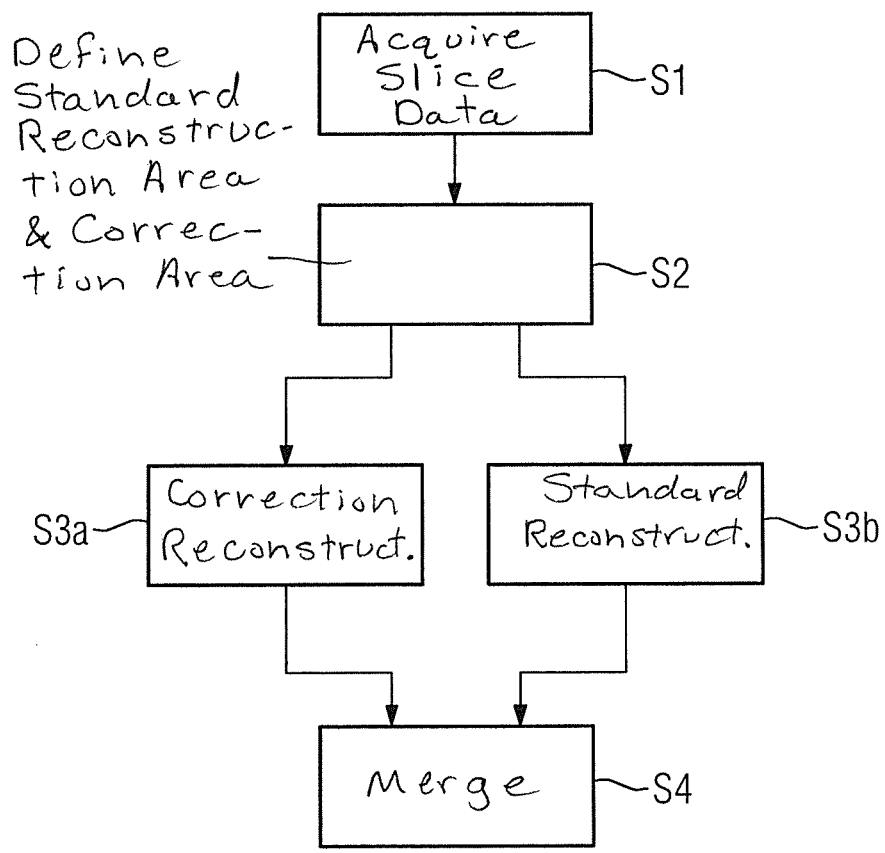

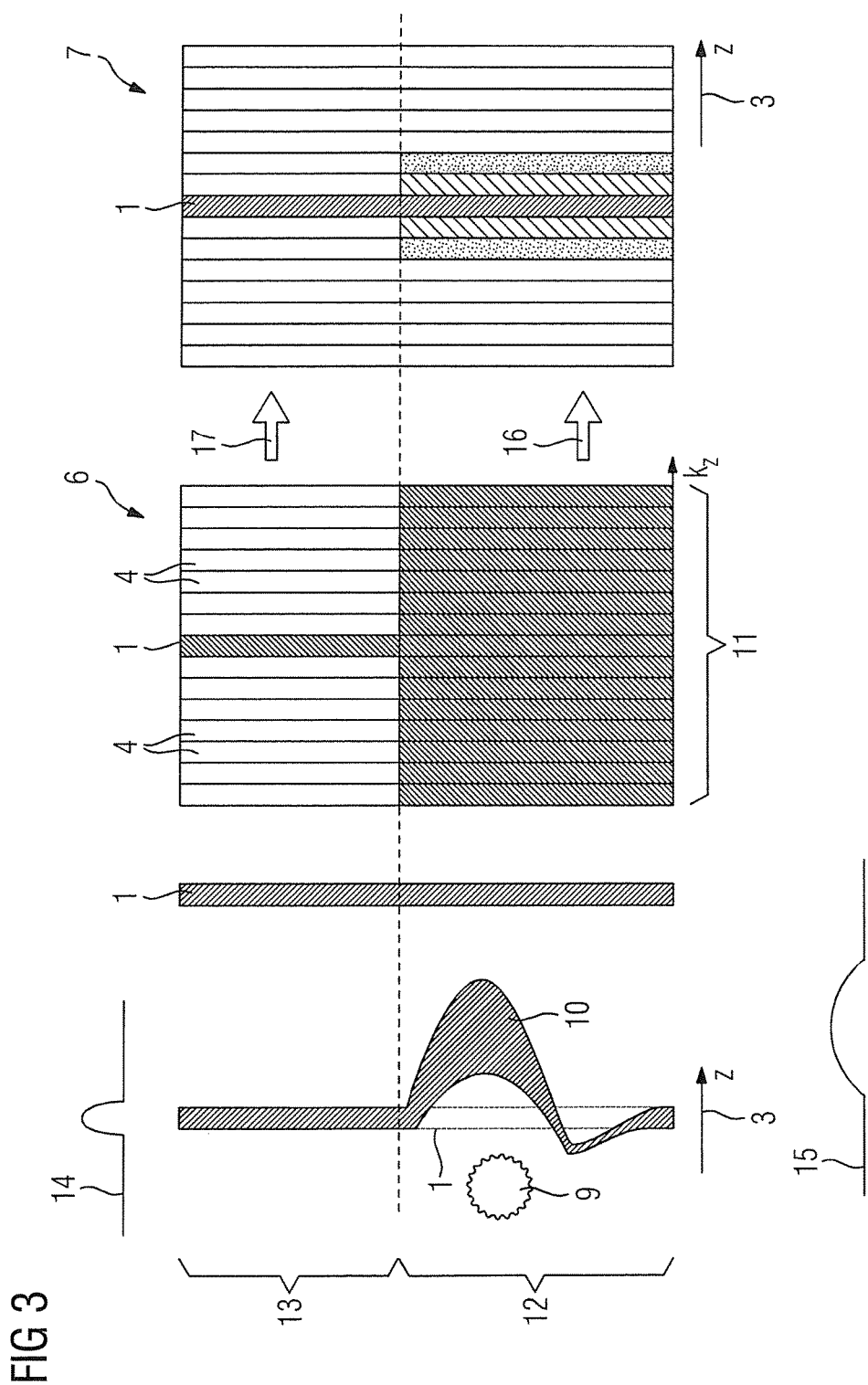

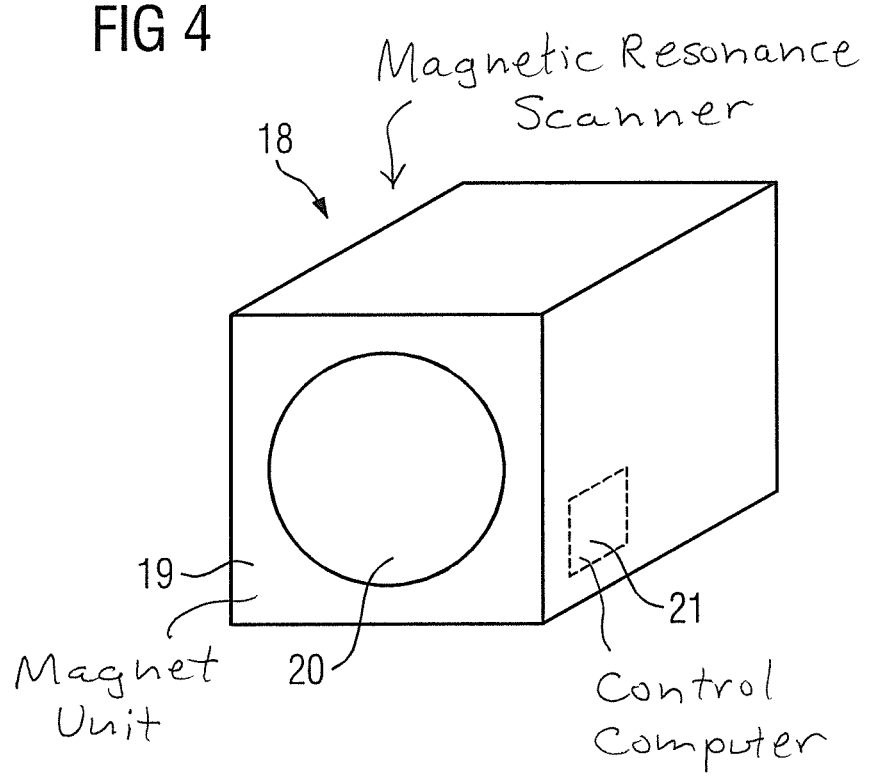

METHOD AND MAGNETIC RESONANCE APPARATUS FOR RECONSTRUCTION OF A THREE-DIMENSIONAL IMAGE DATA SET FROM DATA ACQUIRED WHEN A NOISE OBJECT DISTORTED THE MAGNETIC FIELD IN THE APPARATUS

BACKGROUND OF THE INVENTION

Field of the Invention

The invention concerns a method and magnetic resonance apparatus for reconstruction of a three-dimensional magnetic resonance image data set from magnetic resonance slice data of a target region acquired in target slices by operation of a magnetic resonance scanner of the apparatus while a noise object distorted the magnetic field in the target region, in particular a metal object.

Description of the Prior Art

Magnetic resonance tomography is an imaging modality in widespread use, with which it is possible to acquire magnetic resonance raw data from a three-dimensional target region inside a patient, by acquiring the data from multiple slices of the three-dimensional target region using 2D imaging for each slice. These different slices of the target region (target slices) normally form a so-called slice package which contains a three-dimensional raw data set, from which a three-dimensional magnetic resonance image data set is reconstructed.

It is known, for each target slice to be acquired, in addition to acquiring raw data from a central partition slice of the respective target slice in extent and location, to also acquire raw data from multiple partition slices adjacent to the central partition slice in a supplementary encoding direction perpendicular to the slice plane in a number of phase-encoding steps.

In order to acquire such magnetic resonance data of an object, for example of a patient, the object is normally introduced into a constant magnetic field (B0 field) of the magnetic resonance device, specifically into a homogeneity volume thereof in which only very slight deviations from the nominal value of the constant magnetic field are permitted. This causes nuclear spins in the target region to be oriented in the direction of the constant magnetic field. In order to acquire magnetic resonance raw data, the spins are excited (deflected from alignment with the constant magnetic field) by radio-frequency pulses (excitation pulses) generated by a radio-frequency coil arrangement magnetic resonance signals produced by the decay of this excitation are detected, and values of these signals are entered at respective data entry points in a memory. The acquired and entered raw data are collectively referred to as k-space. In order to enable a spatial encoding of the magnetic resonance data, rapidly switched magnetic gradient fields are superimposed on the constant magnetic field, in particular a slice selection gradient that restricts the excitation to one slice to be measured, a phase encoding gradient, and/or a readout gradient, which ultimately also defines the readout direction. The raw data present in k-space are converted by a Fourier transformation into the image domain in order to reconstruct a magnetic resonance image data set therefrom.

Reconstructing diagnostic-quality magnetic resonance images becomes problematic when the magnetic field to which the spins in the target region are subjected is distorted during the acquisition of the underlying raw data. One reason for such distortion is noise objects that influence the magnetic field in a distorting manner, in particular metal objects, for example implants or the like. Noise objects cause local distortion of the constant magnetic field, which means that exhibits a local inhomogeneity that influences the otherwise constant magnetic field both the excitation of the nuclear spins and the acquisition of the magnetic resonance signals.

An influence that is problematic when imaging different target slices occurs during the excitation. As mentioned, a slice selection gradient is normally activated that is intended to ensure that the magnetic resonance frequency used during the excitation is present only in the area of the slice to be excited, because the resonant frequencies of the nuclear spins in the other slices are shifted by the slice selection gradient such that an excitation of the spins in those other slices does not occur. This is based on the assumption that the constant magnetic field is homogeneous. If this assumption is not applicable, particularly a cuboid target slice will not be excited as is intended, but instead a distorted slice is excited, which can extend over a number of target slices. Acquired signals then do not originate from the desired target slice, but possibly from other target slices or even from outside the target region. This results in artifacts in the reconstructed image.

Magnetic resonance imaging of patients having metallic orthopedic implants is nevertheless becoming increasingly important, due to the rapidly growing population of persons with implants and the enhanced soft-tissue contrast of magnetic resonance imaging compared with other modalities, as well as due to improved magnetic resonance imaging methods that suppress the image distortions in the vicinity of noise objects in an increasingly better fashion than was previously the case.

A procedure for correction of said artifacts is known under the name of SEMAC and is described for example in an article by Lu et al., "SEMAC: Slice encoding for metal artifact correction in MRI", Magnetic Resonance in Medicine 62, pp. 66-76 (2009) and in US 2010/0033179 A1 (where it is referred to under the name "SEPI-VAT"), wherein artifacts caused by metallic noise objects are corrected by a robust slice selection encoding of each excited slice in respect of metal-induced inhomogeneities. The general approach in this known procedure, as noted above, is to perform an additional phase-encoding operation perpendicular to the slice plane (in other words in the slice selection direction) for each target slice to be excited in order to be able to assign correctly in spatial terms the signals from other target slices occurring in the event of distorted excitation. The additional phase-encoding operation in the slice selection direction (supplementary encoding direction) therefore makes it possible to resolve the excitation profile, distorted on account of the noise object, of each target slice and to thereby avoid incorrectly sorting slice data assigned to the target slice, in other words the data are assigned to the correct target slice. In the aforementioned publications, this is performed on the basis of the VAT method. With regard to the procedure described therein, not only—as is already the case for VAT alone—are the "in-plane" distortions therefore reduced, but also distortions between the slices ("through-plane") are reduced, because the acquired signals can be assigned to their actual physical target slices by Fourier transformations along the slice selection direction, namely the supplementary encoding direction. A problem in this procedure, however, is that the overall measurement time is increased significantly because of the multiplicity of additional phase-encoding steps required per target slice in order to resolve the respective excitation profile of each target slice.

Consequently, the spatial resolution in the slice selection direction (supplementary encoding direction) is chosen to be very low, for example in the range of 6-15 phase-encoding steps, in order to keep the measurement time to a minimum. This results in the further problem that the imaging capability of the Fourier transform into the spatial domain (image space) is extremely poor because of the lower resolution. The "point spread function" causes the acquired magnetic resonance signals to overshoot into adjacent target slices, which means that the image clarity is impaired, or in extreme cases incorrect image information is delivered. These more subtle limitations on the image quality are hardly noticeable in the distortion area, where the SEMAC correction is extremely effective, wherein image areas predominate that are sufficiently distant from the disturbances caused by the noise object and are thus not subject to any distortions, but where a reduction of the image quality may nevertheless occur as a result of undesired side-effects of the SEMAC reconstruction.

SUMMARY OF THE INVENTION

An object of the invention is to provide a way to use the SEMAC method that enables an improvement in the image quality, at least in areas that are little affected by distortions.

This object is achieved according to the invention by a method of the type described in the introduction, wherein a correction area and a standard reconstruction area of the target region are determined on the basis of a distortion criterion obtained by evaluating the slice data and that describes the distortion along the supplementary encoding direction. For reconstruction purposes in the standard reconstruction area, only slice data of the target slice are used and in the correction area, the slice data of partition slices lying outside the target slice are assigned to corresponding target slices in order to correct the distortion.

In accordance with the invention therefore, the SEMAC reconstruction is restricted to those image areas, namely the correction areas, in which distortions of the slice profile are actually present, in other words where the SEMAC correction is able to advantageously reduce artifacts caused by the noise object, in particular metal artifacts. Other areas, the standard reconstruction areas, are reconstructed conventionally, meaning based only on the portion of the slice data that relates to the central partition, namely the actual target slice. With regard to the normal reconstruction, it is possible to dispense with the SEMAC distortion correction, in other words the spatial correction and summation of the signals from the individual partition slices.

On the basis of the distortion criterion, image areas are detected in which distortions of the slice profile are present, which benefit from a SEMAC reconstruction, from which the division into correction areas and standard reconstruction areas directly results. It is ultimately necessary to determine whether a signal is present at all outside the central partition slice, in other words the actual target slice; if this is not the case there is usually also no distortion because a signal normally occurs outside the central partition slice only when distortions are also present.

Instead of the usual SEMAC reconstruction wherein the entire image content of the magnetic resonance image data set is reconstructed uniformly, in the method according to the invention different image areas, namely the correction area and the standard reconstruction area, are reconstructed using different methods optimized for the respective image quality. This results in the advantage that negative effects on the image quality can be avoided at least in parts of the magnetic resonance image data set. Such negative effects can, as described in the introduction, originate from the SEMAC encoding or SEMAC distortion correction. These are, for example, the problems arising due to the low-resolution Fourier transform that result in an effective degradation of the slice profile because the very low resolution (high resolutions are not practicable on account of the long measurement time) in the SEMAC dimension (slice selection direction=supplementary encoding direction). This results in signal overshooting into adjacent slice positions, which can be perceived in the image as a change of contrast, poor definition, ghost images and the like. This is avoided by the invention because the areas in which such degradation can occur are identified as standard reconstruction areas, in which the SEMAC reconstruction then is not applied.

There are two different ways of selecting (extracting) the slice data assigned to the respective target slice from the entire slice data for the reconstruction in the standard reconstruction area. The selection of the slice data of the target slice in the standard reconstruction area can take place in k-space, on the basis of the corresponding phase-encoding step prior to a Fourier transform. In this case the selection takes place in k-space because it is known, from the phase-encoding step, which slice data originate from the central partition slice and thus from the target slice. In this embodiment, the data from the adjacent partition slices that has been acquired is discarded in its entirety. This does, however, have the result that not all the slice data are now taken into consideration during the reconstruction, and a decrease in the signal-to-noise ratio can thus result.

In an alternative, preferred variant of the present invention, the selection of the slice data of the target slice in the standard reconstruction area takes place following the Fourier transform into the image domain, taking into consideration all the slice data in k-space. In this manner, all the slice data are still taken into consideration, which is advantageous for the signal-to-noise ratio. Although a Fourier transform in the supplementary encoding direction (slice selection direction) is then nevertheless required, the overshoot (ringing) is not significant because it is removed (excised) in the image domain, and thus effectively also in the spatial domain, because only the slice data of the target slice are further taken into consideration in the standard reconstruction area. It is expedient in this embodiment to check whether a basic shift of the Larmor frequency is present in the standard reconstruction area of the target slice currently under consideration, which can then be taken into account in a corresponding correction.

The standard reconstruction area and the correction area can expediently be determined slice-by-slice. This means that the target slices are considered individually and divided into correction areas and standard reconstruction areas, which, when viewed together, produce the standard reconstruction area and the correction area of the entire target region, namely the reconstruction area of the magnetic resonance image data set.

As mentioned, the distortion criterion is ultimately used for checking whether at least the significant part of the signal is to be found in the candidate area currently under consideration in the central partition slice, which indicates that no distortion is present in said candidate area. To this end, an analysis of the slice data is performed, wherein profiles and/or histograms along the supplementary encoding direction can be analyzed. For this purpose, it is expedient to differentiate between signal components and noise components of the slice data in order to actually be able to make a judgement with respect to the signal component of the slice data, called the signal data in the following.

In this regard, in a preferred embodiment of the invention the evaluation of the distortion criterion takes place pixel-by-pixel for pixels of the target slice in the supplementary encoding direction, in order to segment slice data into signal data and noise data. Such a segmentation can expediently take place on a threshold basis, in particular following a Fourier transform at least in the supplementary encoding direction. For example, a Fourier transform can be performed in at least the supplementary encoding direction, which means that the slice data can also be assigned spatially beyond the phase-encoding step, which is expedient if target slices are to be considered not as a whole in order to assign them in total to the standard reconstruction area or the correction area. If target slices can also be determined as belonging partially to the standard reconstruction area and partially to the correction area, which is the preferred option, a corresponding spatial assignment of the slice data is necessary, which is achieved by the Fourier transform. A threshold value can be utilized in order to separate signal components and noise components from one another and thereby to differentiate signal data and noise data. In this context, in an embodiment the threshold value is ascertained from the slice data of the target slice, in particular as a percentage. In this context it is consequently assumed that, in the non-distorted case, the signal is also actually present spatially in the target slice, which means that the latter is used as a reference in order to define the threshold value. For example, 10-20% of the value of the slice data in the target slice can be used as the threshold value, where it should be noted that a rough estimate of this type is adequate in the context of the method according to the invention since ultimately more pronounced image quality artifacts which can arise as a result of the SEMAC correction are to be avoided.

In a further embodiment, when a threshold value is being ascertained from slice data of the target slice, a statistical consideration is undertaken of a surrounding area of the pixel under consideration. If, for example after a Fourier transform, only a single item of slice data is present inside the target slice for one pixel, it is expedient, in order to already avoid noise effects, to also take a surrounding area into consideration, for example eight or fifteen adjacent pixels in the target slice. The mean value, weighted where applicable, can then be taken into consideration and be employed for definition of the threshold value.

Particularly expediently in the situation when a division of the slice data into noise data and signal data has already been undertaken, in order to evaluate the distortion criterion a histogram analysis and/or an analysis of a slice data progression of the slice data is implemented out in the supplementary encoding direction. This analysis can be restricted to signal data ascertained by segmentation. An assignment to the standard reconstruction area is made if a component of the slice data, in particular of the signal data, exceeding a limit value is located in the central partition slice. This is based on the consideration that, in the case of an undistorted slice profile without considering the noise, the signal should be located completely within the target slice in the manner of a rectangular function. If the slice is distorted however, signal data will also (or exclusively) be present in areas along the supplementary encoding direction which do not exactly correspond to the target slice. This distinction is expressed by the distortion criterion: If the signal is located mostly, for example more than 90% or more than 95%, within the target slice, the non-distorted case is to be assumed and the candidate area under consideration, for example one pixel, is to be assigned to the standard reconstruction area. If not, distortions are present and the candidate area under consideration, in particular one pixel, is to be assigned to the correction area. Sorting then takes place, the results of which are the correction area which is to be corrected as usual by the SEMAC correction, and the standard reconstruction area in which the reconstruction is based solely on the slice data of the target slice, namely the central partition slice.

The reconstruction from the standard reconstruction area and the reconstruction from the correction area are then combined, where provision can be made that image data reconstructed from the standard reconstruction area and from the correction area are merged to produce the magnetic resonance image data set by addition, in particular a sum of squares. A sum of squares is preferred in this situation because an improved noise suppression can be achieved thereby.

The invention also concerns a magnetic resonance apparatus having a control computer designed in order to execute the method according to the invention. All statements relating to the method according to the invention can are applicable to the magnetic resonance apparatus according to the invention, with which the aforementioned advantages can likewise be obtained, in particular high-quality magnetic resonance image data sets of target regions containing a noise object or influenced by a noise object can be obtained. The control computer preferably contains a division unit for division of the data into a correction area and a standard reconstruction area, in particular for each target slice. In addition, a standard reconstruction processor and a SEMAC reconstruction processor that perform the corresponding reconstruction steps can be provided in the control computer, where the image data thus obtained can then be delivered to a merging processor of the control computer.

The present invention also encompasses a non-transitory, computer-readable data storage medium encoded with programming instructions that, when the storage medium is loaded into a control computer of a magnetic resonance apparatus, cause the magnetic resonance apparatus to be operated according to the method described above.

The non-transitory data storage medium can be, for example, a CD-ROM.

BRIEF DESCRIPTION OF THE DRAWINGS

FIG. 2 is a flowchart of the method according to the invention.

FIG. 3 is a schematic diagram explaining the method according to the invention.

FIG. 4 shows a magnetic resonance device according to the invention.

DESCRIPTION OF THE PREFERRED EMBODIMENTS

Figure 1:
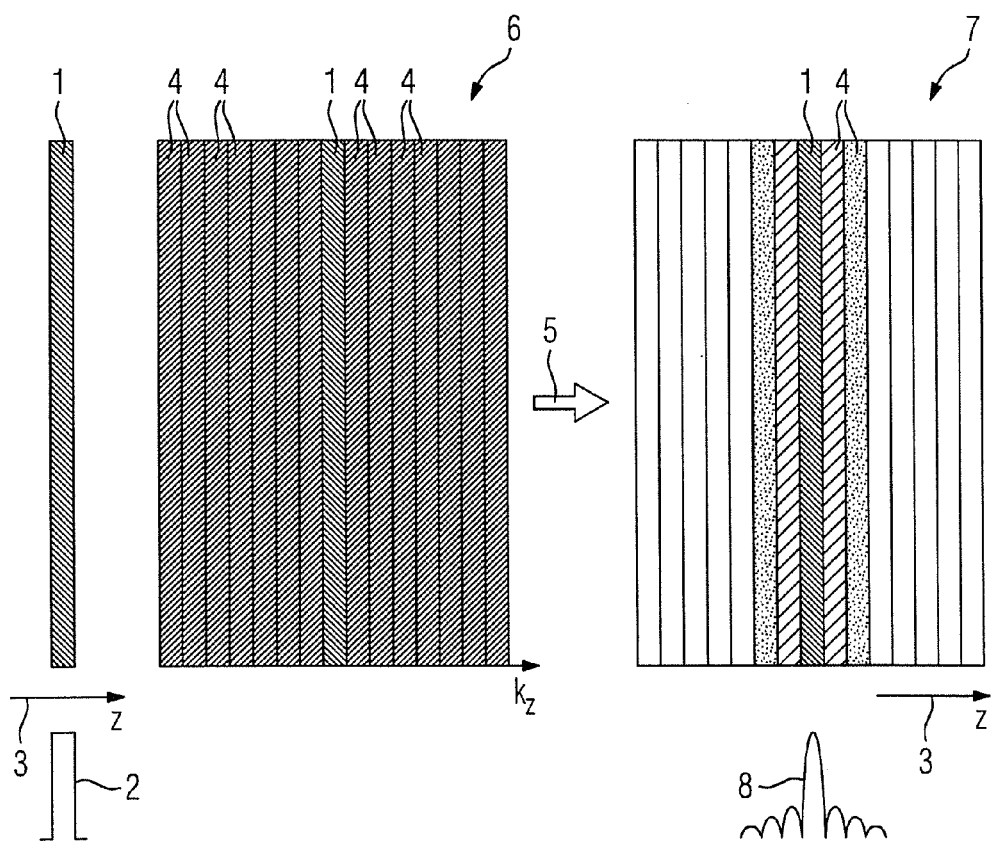
FIG. 1 is a diagram explaining the problem underlying the invention.

FIG. 1 shows in detail the problem underlying the present invention with the example of a target slice 1 having no distortions. If one considers the ideal profile 2 of the magnetic resonance signals, in other words slice data, in the slice selection direction 3, which here when using the SEMAC method also corresponds to the supplementary encoding direction, an idealized rectangular function is produced because the entire signal originates from said target slice 1. When using the SEMAC method, however, not only the target slice 1 is scanned as the central partition slice but in further phase-encoding steps along the slice selection direction 3 as a supplementary encoding direction fourteen adjacent partition slices 4 are likewise scanned in the present case, which means that fifteen phase-encoding steps are used in the present case.

In order to carry out the SEMAC correction, the slice data of the target slice 1 and also of the adjacent partition slices 4 present in the k-space is transferred by Fourier transform from the k-space 6 into the image space 7, as indicated by the arrow 5.

In the supplementary encoding direction 3 only fifteen phase-encoding steps are present, which means that the resolution is quite poor, with the result that an overshoot of signal components into adjacent partition slices (which likewise can correspond to target slices) occurs ("ringing"), which is represented by the hatching or dotting of the partition slice 4 immediately adjacent to the target slice 1 and by the profile 8 in slice selection direction 3. When using the SEMAC correction method, said signal components which have overshot onto adjacent partition slices 4 are now assigned to the corresponding other target slices and may there result in a reduced image quality, particularly if the signal components are not overlaid by dominant actual signal components to be displaced on account of a distortion.

A solution for the above is offered by the method according to the invention, which applies the SEMAC correction only in certain areas, namely the correction areas where it is also required on account of the distortions present there.

A flowchart of an exemplary embodiment of the method according to the invention is illustrated in FIG. 2.

First, in step S1 of the flowchart, slice data for different target slices which cover a target region are acquired using two-dimensional imaging by means of a magnetic resonance device. The target slices follow one another in the slice selection direction, as is known, and are cuboid in shape, in other words collectively they form a slice package in the three-dimensional space. However, because it is known that a metal object is situated as a noise object in the target region, in the present case the hip region, of a patient the magnetic resonance signals are not acquired for each target slice only simply without further differentiation following a high-frequency excitation but there exists an additional phase-encoding operation in the slice selection direction, in other words a supplementary encoding direction, which means that for each target slice data are acquired not only for a central partition slice corresponding to the target slice, but also for adjacent partition slices which are defined by the phase-encoding steps. In this manner a resolution is obtained in the supplementary encoding direction in order to be able to determine in the case of a distorted slice to which other target slices the data is actually to be assigned.

This is explained in detail with regard to FIG. 3. The cross-section through the cuboid target slice 1 is again shown by the dashed line. On account of the metal object 9 indicated schematically it is however not the target slice 1 which is excited during the excitation but a distorted slice 10, where the supplementary encoding direction 3, here the slice selection direction, is again illustrated by way of explanation. Accordingly, as has already been described in this regard with reference to FIG. 1, in step S1 in addition to the central partition slice, corresponding to the target slice 1, partition slices 4 adjacent to the slice are scanned by means of fifteen phase-encoding steps. The acquired magnetic resonance signals of all said partition slices, in other words of the target slice 1 and the adjacent partition slices 4, form the acquired slice data 11. Because of the distortion (distorted slice 10), signal will be measured at least in the area of the distortion also outside the central target slice 1 in adjacent partition slices 4.

It can however also be seen from FIG. 3 that the distortion, in other words the deviation from the desired physical target slice 1, does not occur everywhere; in the present case with reference to the target slice 1, only in one lower area in FIG. 3, which will be referred to in the following as correction area 12. In the remainder of the area, which will be referred to in the following as standard reconstruction area 13, the form of the distorted slice 10 essentially corresponds to the progression of the target slice 1. This does however mean that no SEMAC reconstruction at all with the artifact risk described in FIG. 1 would be necessary in the standard reconstruction area 13, with the result here that the reconstruction can be restricted to the slice data 11 originating from the target slice 1. The method according to the invention utilizes this knowledge and in step S2 defines the standard reconstruction area 13 and the correction area 12 for the entire target region in which a three-dimensional magnetic resonance data set is to be reconstructed, in particular therefore for all the target slices 1. To this end, in the present case first the slice data 11, in the spatial domain in the present case, are divided into signal data and noise data by means of a segmentation method. In this situation the threshold value is defined depending on the slice data in the target slice 1, in other words the central partition slice. If each target slice 1 is being processed pixel by pixel, in order to avoid noise effects as far as possible adjacent surroundings of the pixel are always considered if working in the image space 7. All the slice data 11 having values less than 20% of the signal in the target slice 1 are considered to be among the noise data. A segmentation into signal data and noise data is therefore produced in this way which naturally can also be performed by other means.

In the image space 7, progressions of the signal data then result in the supplementary encoding direction 3 which describe whether a distortion is present. FIG. 3 shows as an example a progression 14 for the standard reconstruction area 13, in which essentially no distortion is present, and an example of a progression 15 for the correction area 12. It can be seen from the progressions 14, 15 whether a distortion is present, whether in other words too high a component of the signal data lies outside the target slice 1. This is decided in the present case in step S2 by a distortion criterion which can for example operate in such a manner that at least 90% of the signal data must lie within the target slice 1.

When it has thus been determined for all the target slices 1 which components belong to the correction area 12 and which components belong to the standard reconstruction area 13, different reconstruction types are applied for both areas 12, 13 in steps S3a and S3b, as illustrated by the arrows 16, 17 and the areas of hatching in the center part-image of FIG. 3. In the correction area 12, step S3a, all the slice data 11 are used and the normal SEMAC correction is performed, which means that signals lying outside the target slice 1 are assigned to the corresponding adjacent target slices 1 (which correspond to adjacent partition slices 4), as is indicated by the hatching of adjacent slices of the target slice 1 in the right-hand part-image in FIG. 3.

For the standard reconstruction area 13 however, step S3b, only the slice data 11 of the target slice 1 is used, which can be selected either in the k-space on the basis of the corresponding phase-encoding step or, which is preferred, following a Fourier transform in the image domain 7, with the result that all the slice data 11 which has been acquired in k-space 6 also continues to be used and the signal-to-noise ratio is thereby improved. As can be seen, only the target slice 1 is accordingly shown highlighted in the standard reconstruction area 13.

The reconstructed image data thus obtained is then merged in a step S4, cf. again FIG. 2, here through addition using squared summation.

A slice package of two-dimensional slices is thereby obtained as a three-dimensional image data set, but it is also possible to derive a completely three-dimensional image data set from the slice package.

The steps S2, S3*a*, S3*b* and S4 are automated in this situation and, implemented by means of a computer program, executed on a computing device, on a control computer of the magnetic resonance apparatus in the present case.

Such a magnetic resonance apparatus has a scanner 18, illustrated schematically in FIG. 4. As is generally known, the scanner has a basic magnet unit 19 which defines a patient receiving cavity 20, surrounding a gradient coil arrangement and a radio-frequency coil arrangement are provided (not illustrated in detail for clarity). A patient table can be used to introduce a patient into the patient receiving cavity 20.

The magnetic resonance scanner 18 operated by a control computer 21, which is designed in order to carry out the method according to the invention. To this end, in the present case the control computer 21 has a division processor for executing the step S2, reconstruction processors for executing the steps S3*a* and S3*b*, and a merging processor for executing the step S4.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for reconstructing a three-dimensional magnetic resonance (MR) image data set from MR slice data, said method comprising:
    operating an MR scanner, while an examination subject is situated in the MR scanner, to acquire raw MR data, as slice data, from a plurality of target slices respectively in parallel slice planes in a target region of the examination subject, including producing a magnetic field, with said MR scanner, in said target region, while a noise object is present in the MR scanner that distorts said magnetic field in said target region;
    operating said MR scanner to activate a gradient magnetic field that defines a supplementary encoding direction perpendicular to said slice planes, and to acquire said slice data for each respective target slice in said plurality of target slices by acquiring MR data from a central partition slice corresponding to the respective target slice in extent and location and also acquiring MR data from a plurality of partition slices, there being no gaps between any adjacent two of said plurality of partition slices along said supplementary encoding direction, and said plurality of partition slices comprising a first partition slice that is immediately adjacent to said central partition slice along said supplementary encoding direction, by activating said gradient magnetic field in a plurality of phase-encoding steps;
    providing said MR data acquired from said target region to a processor and, in said processor, evaluating the slice data to determine a distortion criterion that describes distortion along said supplementary encoding direction resulting from said distortion of said magnetic field by said noise object, and using said distortion criterion to designate a correction area and a standard reconstruction area in said target region;
    in said processor, reconstructing an MR image for at least one of said target slices by applying a first reconstruction algorithm for reconstructing first image data in said standard reconstruction area, that uses only slice data of the respective target slice, and by applying a second reconstruction algorithm in said correction area, that uses slice data that are in partition slices outside of the respective target slice to correct for said distortion; and
    combining the reconstructed first image data and second image data in a data file representing an MR image of the target region, and making the data file available in electronic form at an output of said processor.

2. A method as claimed in claim 1 comprising, in said processor, Fourier transforming all of said slice data and applying said distortion criterion to all of the Fourier transformed slice data.

3. A method as claimed in claim 1 comprising applying said distortion criterion to said slice data slice-by-slice.

4. A method as claimed in claim 1 wherein the slice data for each target slice represent respective pixels of the respective target slice, and applying said distortion criterion to said slice data pixel-by-pixel for each target slice, and thereby segmenting the slice data of the respective target slice into signal data and noise data.

5. A method as claimed in claim 4 comprising segmenting said slice data dependent on a threshold after Fourier transforming the slice data at least in said supplementary encoding direction.

6. A method as claimed in claim 5 comprising using, as said threshold, a percentage value determined from the slice data of the respective target slice by a statistical analysis of an area within the respective target slice surrounding a respective pixel to which the distortion criterion is being applied.

7. A method as claimed in claim 1 comprising, in said processor, determining said distortion criterion by an analysis of the slice data selected from the group consisting of a histogram analysis and a slice data progression analysis, to slice data segmented in the supplementary encoding direction, and assigning slice data to be in said standard reconstruction area when a component of the slice data, that exceeds a predetermined limit value, is situated in said central partition slice.

8. A magnetic resonance (MR) apparatus comprising:
    an MR scanner;
    a control computer configured to operate the MR scanner, while an examination subject is situated in the MR scanner, to acquire raw MR data, as slice data, from a plurality of target slices respectively in parallel slice planes in a target region of the examination subject, including producing a magnetic field, with said MR scanner, in said target region, while a noise object is present in the MR scanner that distorts said magnetic field in said target region;
    said control computer being configured to operate said MR scanner to activate a gradient magnetic field that defines a supplementary encoding direction perpendicular to said slice planes, and to acquire said slice data for each respective target slice in said plurality of target slices by acquiring MR data from a central partition slice corresponding to the respective target slice in extent and location and also acquiring MR data from a plurality of partition slices, there being no gaps between any adjacent two of said plurality of partition slices along said supplementary encoding direction, and said plurality of partition slices comprising a first partition slice that is immediately adjacent to said central partition slice, along said supplementary encoding direction, by activating said gradient magnetic field in a plurality of phase-encoding steps;

said control computer being configured to evaluate the slice data to determine a distortion criterion that describes said distortion along said supplementary encoding direction resulting from said distortion of said magnetic field by said noise object, and using said distortion criterion to designate a correction area and a standard reconstruction area in said target region;

said control computer being configured to reconstruct an MR image for at least one of said target slices by applying a first reconstruction algorithm for reconstructing first image data in said standard reconstruction area, that uses only slice data of the respective target slice, and by applying a second reconstruction algorithm in said correction area, that uses slice data that are in partition slices outside of the respective target slice to correct for said distortion; and said control computer being configured to combine the reconstructed first image data and second image data in a data file representing an MR image of the target region, and making the data file available in electronic form at an output of said processor.

9. A non-transitory, computer-readable data storage medium encoded with programming instructions, said storage medium being loaded into a control computer of a magnetic resonance (MR) apparatus that also comprises an MR scanner, said programming instructions causing said control computer to:

operate the MR scanner, while an examination subject is situated in the MR scanner, to acquire raw MR data, as slice data, from a plurality of target slices respectively in parallel slice planes in a target region of the examination subject, including producing a magnetic field, with said MR scanner, in said target region, while a noise object is present in the MR scanner that distorts said magnetic field in said target region;

operate the MR scanner to activate a gradient magnetic field that defines a supplementary encoding direction perpendicular to said slice planes, and to acquire said slice data for each respective target slice in said plurality of target slices by acquiring MR data from a central partition slice corresponding to the respective target slice in extent and location and also acquiring MR data from a plurality of partition slices, there being no gaps between any adjacent two of said plurality of partition slices along said supplementary encoding direction, and said plurality of partition slices comprising a first partition slice that is immediately adjacent to said central partition slice along supplementary encoding direction, by activating said gradient magnetic field in a plurality of phase-encoding steps;

evaluate the slice data to determine a distortion criterion that describes said distortion along said supplementary encoding direction resulting from said distortion of said magnetic field by said noise object, and using said distortion criterion to designate a correction area and a standard reconstruction area in said target region;

reconstruct an MR image for at least one of said target slices by applying a first reconstruction algorithm for reconstructing first image data in said standard reconstruction area, that uses only slice data of the respective target slice, and by applying a second reconstruction algorithm in said correction area, that uses slice data that are in partition slices outside of the respective target slice to correct for said distortion; and combine the reconstructed first image data and second image data in a data file representing an MR image of the target region, and making the data file available in electronic form at an output of said processor.

* * * * *